(12) United States Patent
Yamazaki

(10) Patent No.: US 6,355,509 B1
(45) Date of Patent: *Mar. 12, 2002

(54) REMOVING A CRYSTALLIZATION CATALYST FROM A SEMICONDUCTOR FILM DURING SEMICONDUCTOR DEVICE FABRICATION

(75) Inventor: Shunpei Yamazaki, Tokyo (JP)

(73) Assignee: Semiconductor Energy Laboratory Co., Ltd., Kanagawa-Ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/014,639

(22) Filed: Jan. 28, 1998

(30) Foreign Application Priority Data

Jan. 28, 1997  (JP) ............................................... 9-029551
Jan. 28, 1997  (JP) ............................................... 9-029552

(51) Int. Cl.[7] .......................... H01L 21/00; H01L 21/84
(52) U.S. Cl. ....................................... 438/149; 438/166
(58) Field of Search ........................... 438/97, 162, 166, 438/486, 199; 257/66

(56) References Cited

U.S. PATENT DOCUMENTS

| | | | | |
|---|---|---|---|---|
| 5,106,768 A | * | 4/1992 | Kuo | ............................ 438/199 |
| 5,569,936 A | * | 10/1996 | Zhang et al. | ................... 257/66 |
| 5,643,826 A | * | 7/1997 | Ohtani et al. | ................. 438/162 |
| 5,654,203 A | * | 8/1997 | Ohtani et al. | ................... 438/97 |
| 5,700,333 A | * | 12/1997 | Yamazaki et al. | .............. 438/97 |
| 5,811,328 A | * | 9/1998 | Zhang et al. | ................. 438/166 |
| 5,843,225 A | | 12/1998 | Takayama et al. | |
| 5,893,730 A | * | 4/1999 | Yamazaki et al. | ........... 438/166 |
| 5,897,347 A | | 4/1999 | Yamazaki et al. | |
| 5,915,174 A | | 6/1999 | Yamazaki et al. | |
| 5,961,743 A | | 10/1999 | Yamazaki et al. | |
| 5,977,559 A | | 11/1999 | Zhang et al. | |
| 6,027,987 A | * | 2/2000 | Yamazaki et al. | ........... 438/486 |
| 6,162,704 A | * | 12/2000 | Yamazaki et al. | ........... 438/471 |

* cited by examiner

Primary Examiner—Long Pham
Assistant Examiner—William David Coleman
(74) Attorney, Agent, or Firm—Fish & Richardson P.C.

(57) ABSTRACT

To remove nickel element after crystallization in fabricating a crystalline silicon film using nickel, a mask 106 is provided on a crystalline silicon film provided by using nickel and P (phosphor) is doped in respect of regions 107 and 109, thereafter, a heating treatment is carried out in an atmosphere including halogen element, in this case, nickel element is moved from a region 108 to the regions 107 and 109 and a thin film transistor is fabricated by utilizing the region 108 where nickel element has been removed.

38 Claims, 12 Drawing Sheets

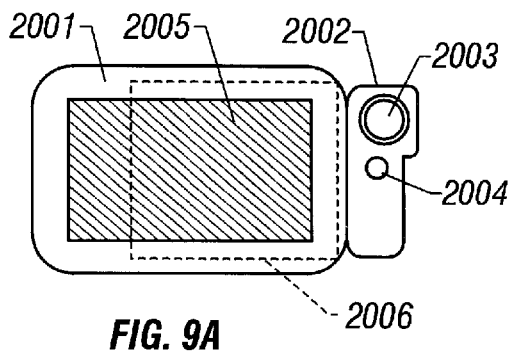
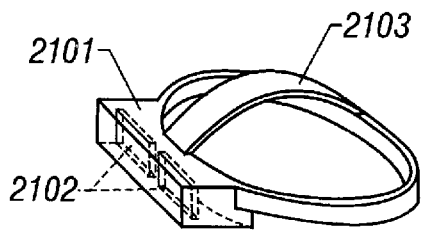
FIG. 9A
FIG. 9B
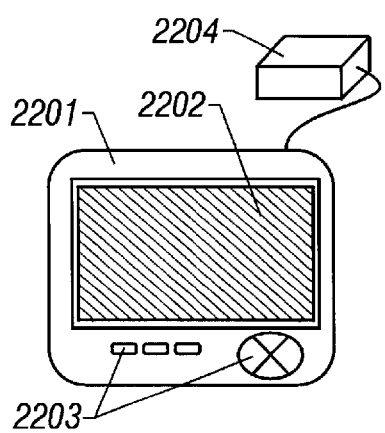
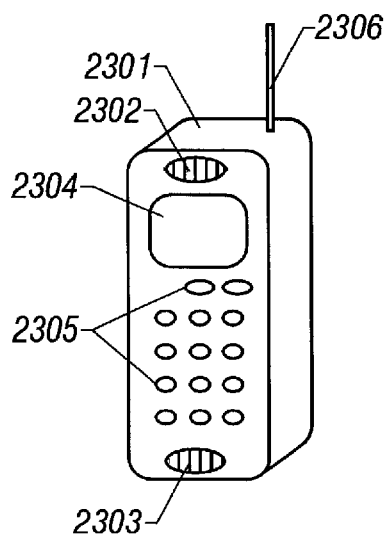
FIG. 9C
FIG. 9D
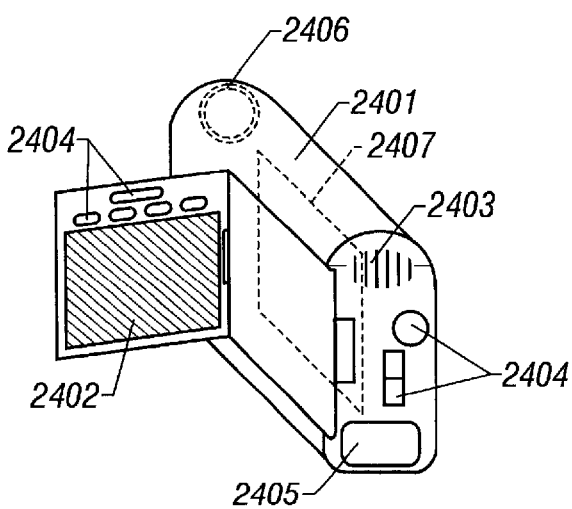
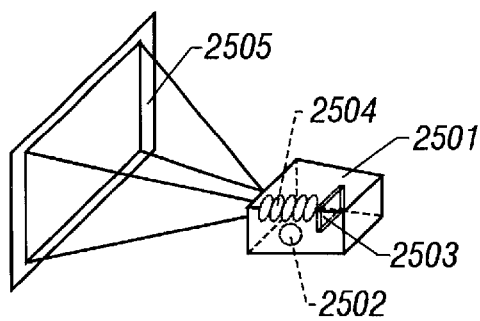
FIG. 9E
FIG. 9F

REMOVING A CRYSTALLIZATION CATALYST FROM A SEMICONDUCTOR FILM DURING SEMICONDUCTOR DEVICE FABRICATION

BACKGROUND OF THE INVENTION

1. Field of the Invention

The present invention disclosed in the specification relates to a method of fabricating a semiconductor device by using a silicon film formed on a substrate of glass or the like. For example, the present invention relates to a method of fabricating a thin film transistor on a glass substrate.

2. Description of the Related Art

A technology of fabricating a thin film transistor on a glass substrate or a quartz substrate is known.

Although the mainstream technology is a thin film transistor using an amorphous silicon film, recently, a silicon film having crystalline performance has also been fabricated.

A thin film transistor using a silicon film having crystalline performance has shown good results.

However, it is difficult to form a silicon film having high crystalline performance uniformly in a large area.

Further, it is desirable to use an inexpensive glass substrate as a substrate. However, a technology of providing a crystalline silicon film at a processing temperature that the glass substrate can withstand is needed. This is an important technological problem.

A laser annealing process can be used as a process having a process temperature that the glass substrate can withstand. The laser annealing process is superior in that almost no thermal impact is caused in the substrate.

However, the following problems exist.

(1) It is difficult to carry out laser annealing uniformly over a large area.

(2) Oscillation intensity of the laser beam used in the process is unstable.

One known technology is disclosed in Unexamined Published Japanese Patent Application No. 7-321339 as a means for resolving these problems.

In this technology, a crystalline silicon film is provided by performing a heating treatment at a temperature that a glass substrate can withstand and by introducing a metal element for promoting the crystallization of silicon, such as nickel or the like, into an amorphous silicon film.

When the technology disclosed in Unexamined Published Japanese Patent Application No. 7-321339 is used, the resulting crystalline silicon film has excellent quality not previously obtained (meaning that not only is crystalline performance excellent, but a TFT (Thin Film Transistor) having excellent properties results) over a large area.

However, a problem of dispersion or unstableness still exists, which seems to be caused by the metal element remaining in the silicon.

SUMMARY OF THE INVENTION

The present invention disclosed in the specification provides the means for resolving the problem.

In one aspect, the present invention provides a method of fabricating a semiconductor device comprising:

a step of introducing a metal element for promoting the crystallization of silicon into an amorphous silicon film;

a step of providing a crystalline silicon film by crystallizing the amorphous silicon film by performing a heating treatment;

a step of masking a portion of the crystalline silicon film and accelerating and implanting ions of an impurity element to another portion;

a step of moving the metal element for promoting the crystallization of silicon present in the crystalline silicon film by performing a heating treatment; and a step of forming an activation layer of a semiconductor device by utilizing the masked region.

In another aspect, the present invention provides a method of fabricating a semiconductor device comprising:

a step of introducing a metal element for promoting the crystallization of silicon into an amorphous silicon film;

a step of providing a crystalline silicon film by crystallizing the amorphous silicon film by performing a heating treatment;

a step of irradiating a laser beam on the crystalline silicon film;

a step of masking a portion of the crystalline silicon film and accelerating and implanting ions of an impurity element to another portion;

a step of moving the metal element for promoting the crystallization of silicon present in the crystalline silicon film by performing a heating treatment; and a step of forming an activation layer of a semiconductor device by utilizing the masked region.

In another aspect, the present invention provides a method of fabricating a semiconductor device comprising:

a step of introducing a metal element for promoting the crystallization of silicon into an amorphous silicon film;

a step of providing a crystalline silicon film by crystallizing the amorphous silicon film by performing a heating treatment;

a step of masking a portion of the crystalline silicon film and accelerating and implanting ions of an impurity element to another portion;

a step of moving the metal element from the masked region to the region where the impurity element has been doped by performing a heating treatment; and a step of forming an activation layer of a semiconductor device by utilizing the masked region.

In another aspect, the present invention provides a method of fabricating a semiconductor device comprising:

a step of selectively introducing a metal element for promoting the crystallization of silicon into an amorphous silicon film formed on a substrate having an insulating surface;

a step of providing a crystalline silicon film by making crystals grow from a region where the metal element has been selectively introduced in a direction in parallel with the substrate by performing a heating treatment;

a step of masking a portion of the crystalline silicon film and accelerating and implanting ions of an impurity element to another portion;

a step of moving the metal element for promoting the crystallization of silicon present in the masked crystalline silicon film to the other portion by performing a heating treatment; and a step of forming an activation layer of a semiconductor device by utilizing the masked region.

In another aspect, the present invention provides a method of fabricating a semiconductor device comprising:

a step of selectively introducing a metal element for promoting the crystallization of silicon into an amorphous silicon film formed on a substrate having an insulating surface;

a step of providing a crystalline silicon film by making crystals grow from a region where the metal element has been selectively introduced in a direction in parallel with the substrate by performing a heating treatment;

a step of irradiating a laser beam on the crystalline silicon film;

a step of masking a portion of the crystalline silicon film and accelerating and implanting ions of an impurity element to another portion;

a step of moving the metal element for promoting the crystallization of silicon present in the crystalline silicon film to the region where the impurity element has been accelerated and implanted by performing a heating treatment; and a step of forming an activation layer of a semiconductor device by utilizing the masked region.

In another aspect, the present invention provides a method of fabricating a semiconductor device comprising:

a step of selectively introducing a metal element for promoting the crystallization of silicon into an amorphous silicon film formed on a substrate having an insulating surface;

a step of providing a crystalline silicon film by making crystals grow from a region where the metal element has been selectively introduced in a direction in parallel with the substrate by performing a heating treatment;

a step of masking a portion of the crystalline silicon film and accelerating and implanting ions of an impurity element to another portion;

a step of moving the metal element from the masked region to a region where the impurity element has been doped by performing a heating treatment; and a step of forming an activation layer of a semiconductor device by utilizing the masked region.

During the step of moving the metal element, it is preferable to perform the heating treatment in an atmosphere including oxygen.

Further, it is preferable to utilize Ni (nickel) as the metal element for promoting the crystallization of silicon.

Further, as a metal element for promoting the crystallization of silicon, one or more elements selected from the group consisting of Fe, Co, Ni, Ru, Rh, Pd, Os, Ir, Pt, Cu and Au can be utilized.

Furthermore, it is preferable to utilize P (phosphor) as the impurity element that is accelerated and implanted into the crystalline silicon film. Other than P, a material selected from a group consisting of N, As, Sb and Bi, which belong to the same periodic group as P, can be used.

Further, it is important to select the masked region to avoid the region where the metal element has selectively been introduced.

BRIEF DESCRIPTION OF THE DRAWINGS

FIGS. 9(A), 9(B), 9(C), 9(D), 9(E) and 9(F) are views showing devices using the present invention;

DETAILED DESCRIPTION OF THE PREFERRED EMBODIMENT

As shown by FIGS. 1(A), 1(B), 1(C), 1(D) and 1(E), a portion of a crystalline silicon film, which has been crystallized by utilizing nickel as a metal element for promoting the crystallization of silicon, is masked by a resist mask 106, and P (phosphor) ions are accelerated and implanted into a region which has not been masked.

As a result, P ions are doped into regions 107 and 109. Furthermore, these regions are impaired by bombardment of ions and are made amorphous.

Figure 2A:
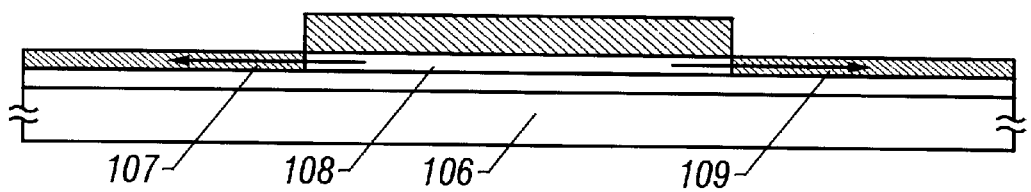
FIGS. 2(A), 2(B), 2(C), 2(D) and 2(E) are views showing fabrication steps of a thin film transistor.

The structure is subjected to a heating treatment in an atmosphere including chlorine as shown in FIG. 2(A), during which the nickel element is moved from a masked region 108 to the regions 107 and 109 where P has been accelerated and implanted.

In this way, the nickel element is removed from the masked region 108. An activation layer of a thin film transistor is formed by utilizing this region.

In this way, the thin film transistor can be fabricated after removing the adverse influence of the nickel element.

(Embodiment 1)

An outline of the fabrication steps of one embodiment will be shown in reference to FIGS. 1(A), 1(B), 1(C), 1(D) and 1(E) and FIGS. 2(A), 2(B), 2(C), 2(D) and 2(E).

Figure 1A:
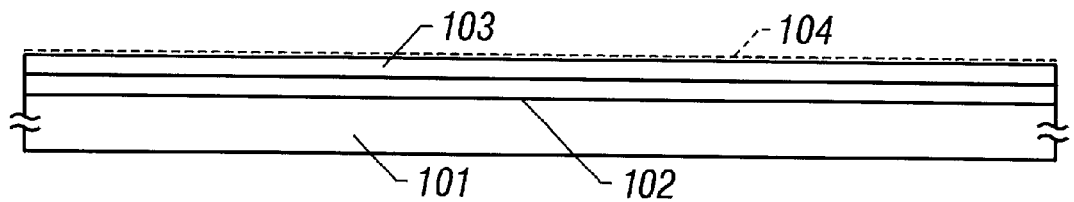
FIGS. 1(A), 1(B), 1(C), 1(D) and 1(E) are views showing fabrication steps of a thin film transistor.
Figure 1B:
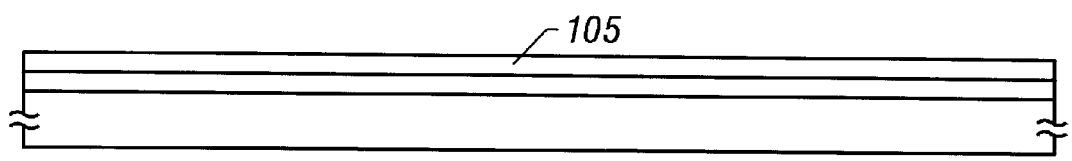

First, as shown by FIG. 1(A), a silicon oxide film 102 is formed to a thickness of 3000 Å, using a plasma CVD (Chemical Vapor Deposition) process, as an underlayer film on a glass substrate 101.

Next, an amorphous silicon film 103 is formed to a thickness of 4000 Å using a low pressure thermal CVD process (or plasma CVD process). Incidentally, Ge may be included in the amorphous silicon film 103.

When the amorphous silicon film 103 has been formed, an extremely thin oxide film (not illustrated) is formed on the surface. In this case, the extremely thin oxide film is formed by irradiating a UV (Ultra Violet) ray in an atmosphere of oxygen. The oxide film promotes wettability by a solution to be coated in later steps.

Next, a nickel acetate solution including 10 ppm of nickel (in terms of weight) is coated. Extraneous solution is removed by a spin coater.

As a result, a state in which nickel element is brought into contact with and held by the surface of the amorphous silicon film 103, as indicated by numeral 104, is obtained. (FIG. 1(A))

When the state shown by FIG. 1(A) is obtained, a heating treatment is performed at 600° C. for 6 hours, during which the amorphous silicon film 103 is crystallized. Thereby, a crystalline silicon film 105 is obtained.

The heating treatment can be carried out at temperatures of 550° C. through 700° C., preferably 600° C. through 650° C. It is necessary to set the upper limit of the heating temperature below the strain point of the glass substrate.

Figure 1C:
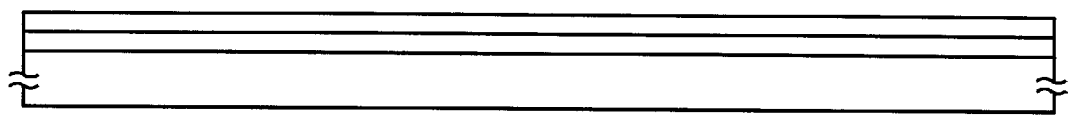

Next, a laser beam is irradiated on the crystalline silicon film 105, as shown by FIG. 1(C). In this case, a KrF excimer laser (wavelength 248 nm) is used.

An excimer laser is a pulse oscillation type of laser, and by irradiating the laser beam, instantaneous melting and solidification of an irradiated region repeatedly occurs.

A kind of nonequilibrium state is formed by irradiating the excimer laser beam. Specifically, a projection referred to as ridge is formed on the surface and the nickel element is segregated partially.

Under such a nonequilibrium state, the nickel element moves easily when energy is applied from outside.

Figure 1D:
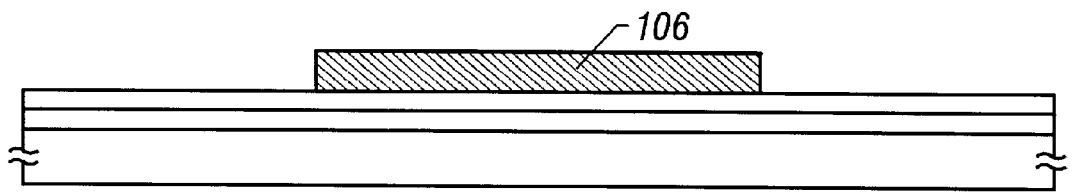

When irradiation of the laser beam stops, a mask 106 comprising a silicon oxide film is formed, as shown by FIG. 1(D).

Next, P (phosphor) element is doped by a plasma doping process (or ion implantation process).

The condition of doping is set such that the final concentration of P element is greater than the concentration of nickel element remaining in the silicon film by at least one order of magnitude.

According to a measurement by the inventors, the maximum value of the concentration of nickel element remaining in the silicon film upon completion of the step of FIG. 1(C) is about $1 \times 10^{19}$ atoms cm$^{-3}$.

Accordingly, in this case, the doping condition is set such that the P element is doped to a minimum concentration of about $1 \times 10^{20}$ atoms cm$^{-3}$ or more.

Figure 1E:
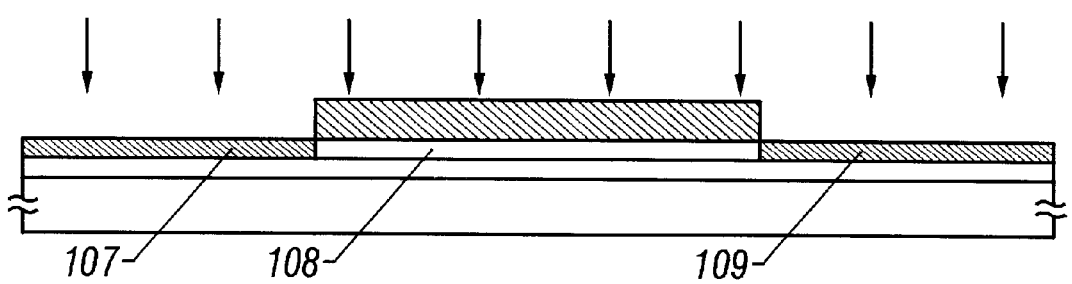

The doping of P ions is carried out in regions 107 and 109 in FIG. 1(E). As a result of the doping, the regions 107 and 109 include high concentrations of P. Further, these regions are made amorphous by bombardment of implanted ions.

Further, in a region shown by the numeral 108, the P element is not doped due to the presence of the mask 106 comprising a silicon oxide film. The region 108 maintains crystalline performance.

After doping with the P element, the sample is subjected to a heating treatment. In this case, the sample is arranged in a heating furnace with an atmosphere of a mixture gas of nitrogen (partial pressure ratio of 88%), oxygen (partial pressure ratio of 10%) and hydrogen chloride (partial pressure ratio of 2%), where a heating treatment is carried out at 400° C. for 30 minutes.

In this step, the nickel element in the region 108 is moved to the regions 107 and 108 by the operation of P (phosphor). (FIG. 2(A))

The movement of the nickel element is expedited by the fact that the nickel element is easy to move because of the previous irradiating operation of the laser beam and the fact that the regions 107 and 109 are made amorphous.

In particular, the fact that the regions 107 and 109 are made amorphous and include much defect and strain plays a significant role in moving nickel element to these regions.

Further, in this case, a thin oxide film (thermally oxidized film) is formed on the surfaces of the exposed silicon films (surfaces of regions 107 and 109) where the nickel element is absorbed by the operation of halogen a element.

Further, when the laser beam is not irradiated, the heating temperature must be elevated further to a temperature of, for example, 600° C. or higher.

Then, by exposing the regions 107 and 108 to the above-described atmosphere, the very thin thermally oxidized film is formed and nickel element is gettered into the film.

In this step, the regions 107 and 109 are brought into a porous state since etching is excessively progressed locally. (The region can never be utilized to form an element).

Figure 2B:
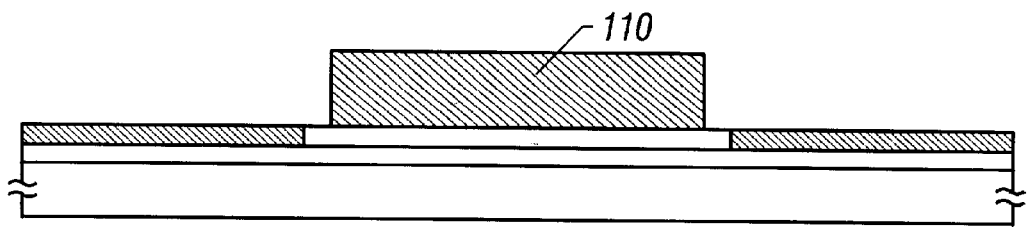
Figure 2C:
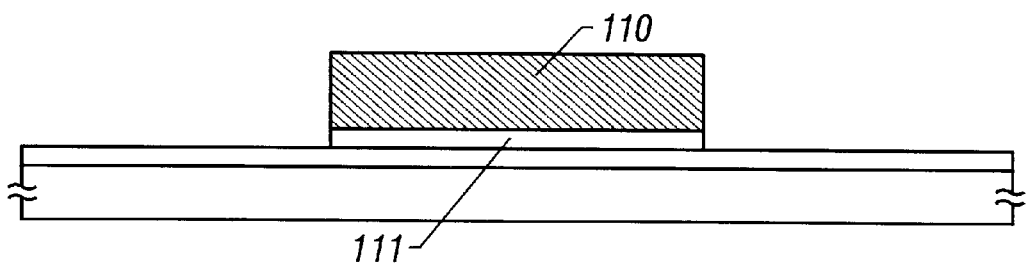
Figure 2D:
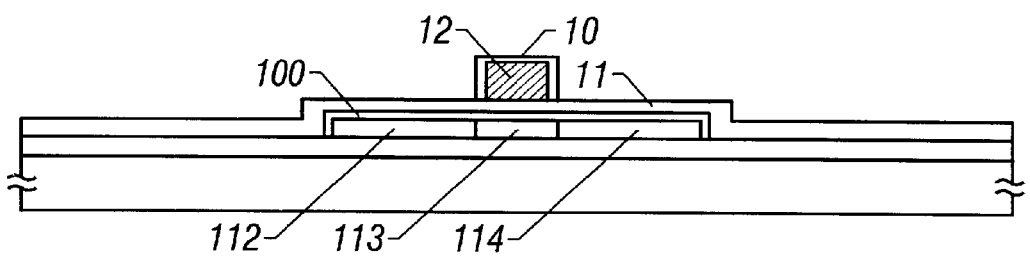

When the heating treatment has been finished, the mask 106 comprising a silicon oxide film is removed. Next, as shown by FIG. 2(B), a resist mask 110 is formed. The resist mask covers an area that is narrower than the region covered by the mask 106.

The silicon film is patterned by utilizing the resist mask 110. As a result, a pattern of a crystalline silicon film designated by the numeral 111 is obtained. The pattern is to constitute an activation layer of a thin film transistor at later steps. (FIG. 2(C))

With respect to the crystalline silicon film, nickel element in the film has been removed from the film.

When the pattern designated by the numeral 111 is provided, the resist mask 110 is removed. Further, a gate insulating film is provided by covering the silicon film pattern 111, where films designated by numerals 100 and 111 are laminated.

In this case, a silicon oxide film 11 of 1000 Å is formed by a plasma CVD process and the oxide film 100 of about 50 Å is formed by a thermal oxidation process, whereby the gate insulating film is formed. The preferred condition of this thermal oxidation is that the substrate temperature is 950° C., the atmosphere is oxygen mixed with 3% HCl, and the duration is one hour.

In this case, the oxide film 100 that is formed later is formed at the inner side of the silicon oxide film 11 that is formed by a CVD process. (FIG. 2(D))

When the gate insulating film has been formed, a gate electrode 12 having a major component of aluminum is formed. An anodized film 10 is formed on the gate electrode 12 by an anodic oxidation process after forming the pattern. The anodized film 10 electrically and mechanically protects the surface of the aluminum film, which has low heat resistance.

Next, an impurity is doped in order to form a source and a drain region. In this case, P (phosphor) ions are doped by a plasma doping process to fabricate a thin film transistor of an N-channel type.

In this step, P element is doped into the regions 112 and 114. The numeral 112 designates the source region, and the numeral 114 designates the drain region. Also, a region 113 designates a channel region.

After finishing the doping operation, a laser beam is irradiated so that portions destroyed by the doping operation are annealed and the dopant is activated.

Figure 2E:
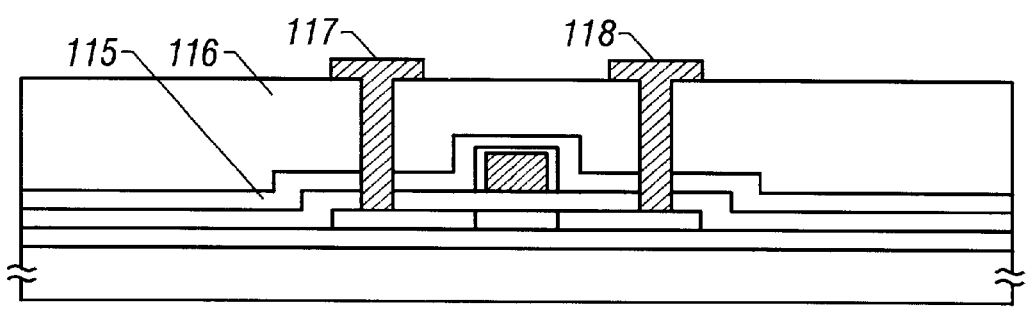

Next, as shown by FIG. 2(E), a silicon nitride film 115 is formed to a thickness of 2000 Å, using a plasma CVD process, as an interlayer insulating film.

Further, a polyimide resin film 116 is formed by a spin coating process. When a resin film is used for the interlayer insulating film 116, the surface can be flattened.

A material of polyamide, polyimide amide, epoxy resin, acrylic resin or the like can be used for the material of the resin film.

Next, contact holes are formed and a source electrode 117 and a drain electrode 118 are formed. In this way, a thin film transistor is finished. (FIG. 2(E))

(Embodiment 2)

FIG. 3 and FIG. 4 show an outline of the fabrication steps of this embodiment. This embodiment shows a crystallizing method that is different from that in Embodiment 1.

Figure 3A:
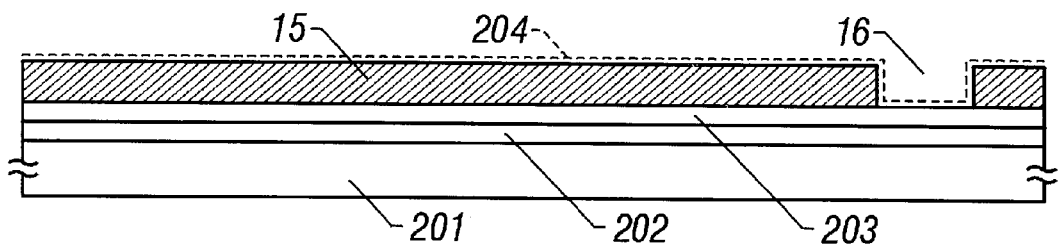
FIGS. 3(A), 3(B), 3(C), 3(D) and 3(E) are views showing fabrication steps of a thin film transistor.
Figure 3B:
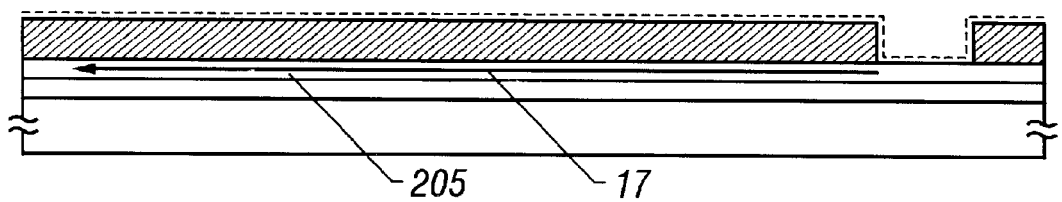

First, as shown by FIG. 3(A), a silicon oxide film 202 is formed as an underlayer film on a glass substrate 201 to a thickness of 3000 Å using a plasma CVD process.

Next, an amorphous silicon film 203 is formed to a thickness of 4000 Å using a low pressure thermal CVD process (or plasma CVD process).

When the amorphous silicon film 203 has been formed, an extremely thin oxide film, not illustrated, is formed on the surface. In this case, the extremely thin oxide film is formed by irradiating a UV light in an atmosphere of oxygen. The oxide film has a function of promoting the wettability of a solution coated in later steps.

Next, a mask 15 comprising a silicon oxide film is formed. The mask is provided by forming a silicon oxide film having a thickness of 1000 Å by using a plasma CVD process and patterning the film.

An opening having a slit-like shape designated by numeral 16 is formed at the mask 15. The amorphous silicon film 203 is exposed at the region of the slit 16.

Next, a nickel acetate solution including 10 ppm of nickel (in terms of weight) is coated. Extraneous solution is removed by a spin coater.

As a result, a state where nickel element is brought into contact and held by the film, as designated by numeral 204, is provided. In this case, nickel element is brought into a state where it is brought into contact with and held by the surface of the amorphous silicon film 203 only at the region of the opening 16. (FIG. 3(A))

When the state shown by FIG. 3(A) has been provided, a heating treatment is carried out at 600° C. for 6 hours. In this step, as designated by numeral 17, crystal growth progresses in a direction in parallel with the substrate 201 from the region where nickel element has been selectively introduced (region of opening 16). Thus, a crystalline silicon film 205 is provided. (FIG. 3(B))

The heating treatment can be carried out at temperatures of 550° C. through 700° C., preferably 600° C. through 650° C. Incidentally, it is necessary to set the upper limit of the heating temperature below the strain point of the glass substrate.

Figure 3C:
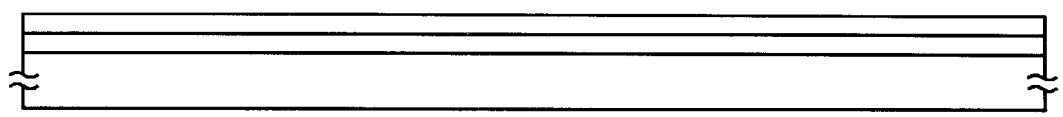

Next, as shown by FIG. 3(C), a laser beam is irradiated on the crystalline silicon film 205 that has been provided through the above-described steps. In this case, a KrF excimer laser (wavelength 248 nm) is used.

The excimer laser is a pulse oscillation type of laser, and by irradiating the laser beam, instantaneous melting and solidification of the irradiated region repeatedly occurs.

By irradiating the excimer laser beam, a kind of nonequilibrium state is produced. Specifically, projections referred to as ridges are formed on the surface and the nickel element is partially segregated.

Under such a nonequilibrium state, when some energy is supplied from outside, the nickel element is easy to move.

Figure 3D:
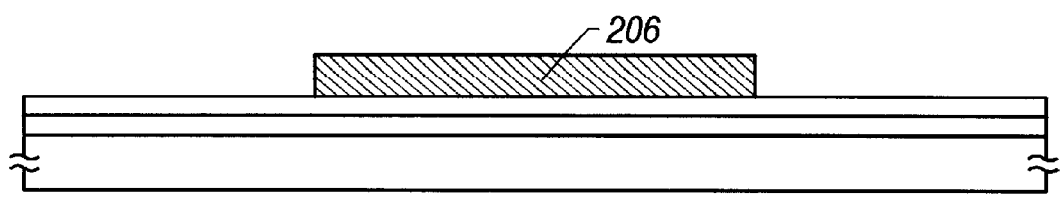

When irradiation of the laser beam stops, as shown by FIG. 3(D), a mask 206 comprising a silicon oxide film is formed.

It is important that the region covered by the mask 206 avoids the region where nickel element was previously introduced.

The reason is that the region that has not been covered by the mask 206 is to be removed in later steps, and in this case, it is preferable to simultaneously remove a region where nickel element has been introduced and an initiation point of crystal growth (nickel element is included at comparatively high concentration).

Next, P (phosphor) element is doped by a plasma doping process (or ion implantation process).

The condition of doping is set such that the final concentration of P element is greater than the concentration of nickel element remaining in the film by at least one order of magnitude.

According to a measurement by the inventors, the maximum value of the concentration of nickel element remaining in the silicon film when the step of FIG. 3(C) has been finished is about $1 \times 10^{19}$ atoms cm$^{-3}$.

Accordingly, in this case, the doping condition is set such that the concentration of doped P element in the film is at least about $1 \times 10^{20}$ atoms cm$^{-3}$ or more.

Figure 3E:
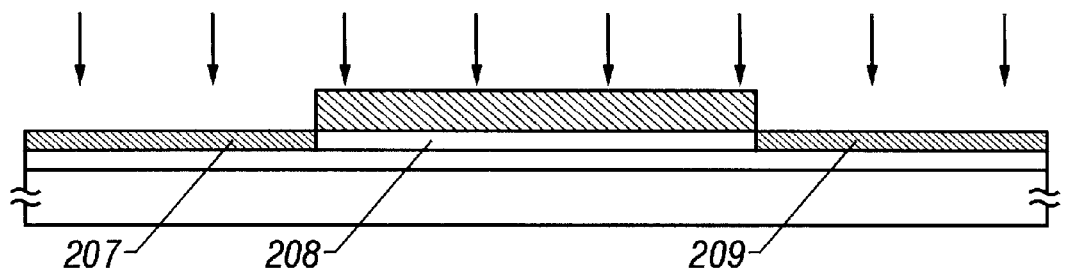

The doping of P ions is carried out in regions 207 and 209 of FIG. 3(E). As a result of the doping, the regions 207 and 209 include P at high concentrations. Further, these regions are made amorphous by bombardment of implanted ions.

Further, a region designated by numeral 208 has not been doped with P element due to the presence of the mask 206. The region 208 maintains crystalline performance.

After doping with the P element, the sample is subjected to a heating treatment. In this case, the sample is arranged in a heating furnace with an atmosphere of a mixture gas of nitrogen (partial pressure ratio of 88%), oxygen (partial pressure ratio of 10%) and hydrogen chloride (partial pressure ratio of 2%), and the heating treatment is carried out at 400° C. for 30 minutes.

In this step, nickel element in the region 208 is moved to the regions 207 and 208 by the operation of P (phosphor). (FIG. 4(A))

The movement of nickel element is promoted by the fact that nickel element is easy to move because of the previous irradiation by the laser beam and the fact that the regions 207 and 209 have been made amorphous.

In particular, the fact that the regions 207 and 209 have been made amorphous and include much defect or strain plays a significant role in moving nickel element to these regions.

In this step, the regions 207 and 209 are brought into a porous state since the etching operation is excessively progressed locally. (The region cannot be utilized in forming an element at all.)

Incidentally, when the irradiation of the laser beam is not carried out, it is necessary to elevate the heating temperature to 600° C. or higher. The reason is that the nickel element is not so easy to move.

When the heating treatment has been finished, the mask 206 comprising a silicon oxide film is removed. Further, as shown by FIG. 4(B), a resist mask 210 is formed. The resist mask covers an area that is narrower than the area covered with the mask 206.

The silicon film is patterned by utilizing the resist mask 210. As a result, the region where nickel element is segregated is removed. (The above-described steps are referred to as lateral gettering.)

In this way, a pattern of a crystalline silicon film designated by the numeral 211 is obtained. The pattern is to constitute an activation layer of a thin film transistor in later steps. (FIG. 4(C))

With respect to the crystalline silicon film, nickel element in the film has been removed from the film.

When the pattern designated by the numeral 211 is obtained, the resist mask 210 is removed. Further, a gate insulating film is provided to cover the silicon film pattern 211, where films designated by numerals 200 and 211 are laminated.

In this case, a silicon oxide film 21 having a thickness of 1000 Å is formed by a plasma CVD process, and an oxide film 200 having a thickness of about 50 Å is formed by a thermal oxidation process, whereby the gate insulating film is formed. The preferred condition of this thermal oxidation is that the substrate temperature is 950° C., the atmosphere is oxygen mixed with 3% HCl, and the duration is one hour.

In this case, the thermally oxidized film 200 that is formed later is formed at the inner side of the silicon oxide film 21 that is formed by a CVD process. (FIG. 4(D))

When the gate insulating film has been formed, a gate electrode 22 having a major component of aluminum is formed. An anodized film 20 is formed on the gate electrode 22 by an anodized oxidation process after forming the pattern. The anodized film has a function of electrically and mechanically protecting the surface of the aluminum film, which has low heat resistance.

Next, an impurity is doped in order to form a source and a drain region. In this case, P (phosphor) ions are doped by a plasma doping process to fabricate a thin film transistor of an N-channel type.

In this step, P element is doped into regions 212 and 214. The numeral 212 designates the source region, and the numeral 214 designates the drain region. Further, a region 213 constitutes a channel region.

A laser beam is irradiated after finishing the doping process, so that portions destroyed by the doping process are annealed and the dopant is activated.

Figure 4A:
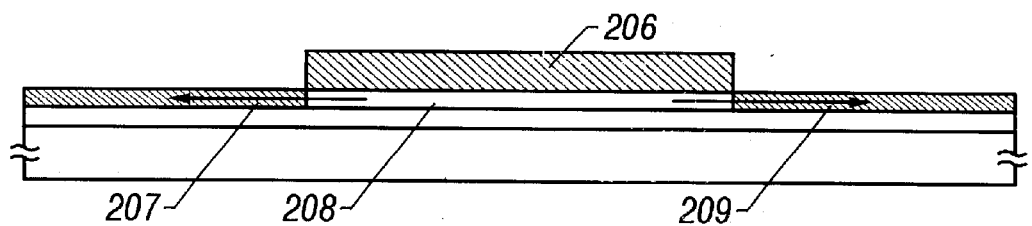
FIGS. 4(A), 4(B), 4(C), 4(D) and 4(E) are views showing fabrication steps of a thin film transistor.
Figure 4B:
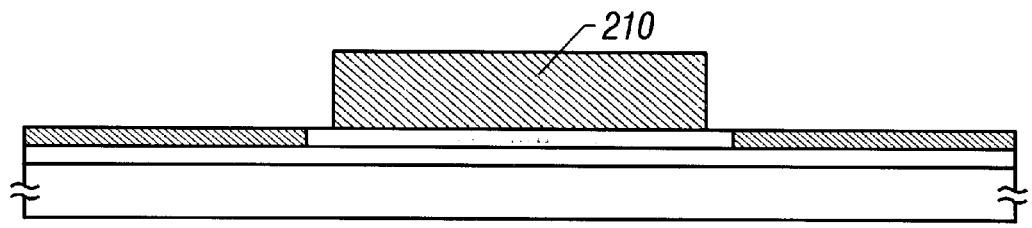
Figure 4C:
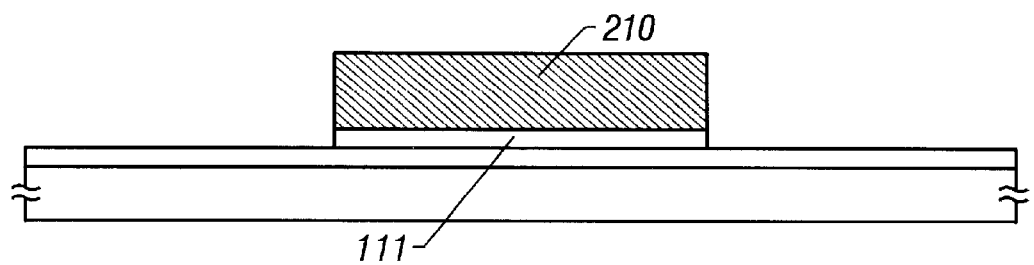
Figure 4D:
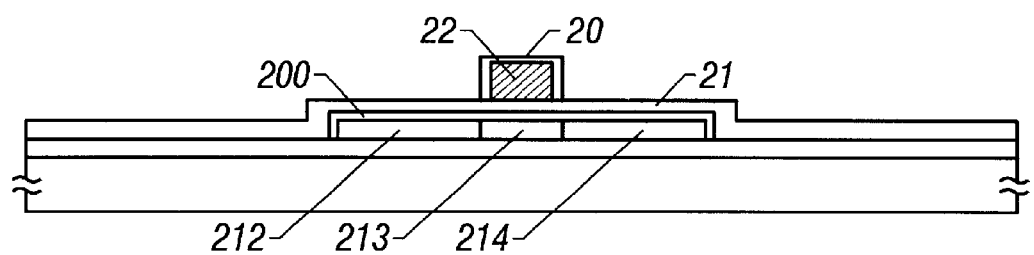
Figure 4E:
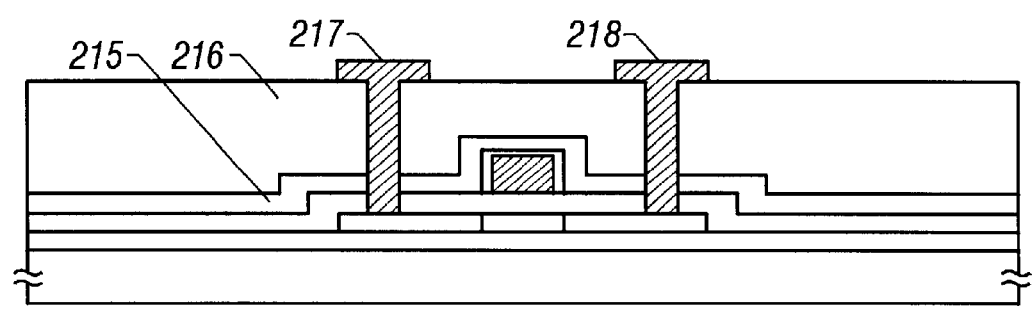

Next, as shown by FIG. 4(E), a silicon nitride film 215 is formed to a thickness of 2000 Å, using a plasma CVD process, as an interlayer insulating film.

Further, a polyimide resin film 216 is formed by a spin coating process. When a resin film is used for the interlayer insulating film, the surface can be flattened.

As a material of the resin film, a material of polyamide, polyimide amide, epoxy resin, acrylic resin or the like can be utilized.

Further, contact holes are formed and a source electrode 217 and a drain electrode 218 are formed. In this way, a thin film transistor is finished. (FIG. 4(E))

(Embodiment 3)

In this embodiment, in the step of gettering nickel of Embodiment 1 shown by FIG. 2(A) and the step of gettering nickel of Embodiment 2 shown by FIG. 4(A), a treatment is carried out by using a solution mixed with hydrogen fluoride and hydrogen peroxide instead of performing a heating treatment in an atmosphere including halogen element. In this case, nickel and nickel silicide are selectively etched.

(Embodiment 4)

This embodiment relates to a method of controlling a threshold value of a TFT in the constructions shown by Embodiment 1 and Embodiment 2.

In this case, a small amount of B (boron) is doped in forming the amorphous silicon film 103 shown by FIG. 1(A). The doping is carried out by mixing a small amount of $B_2H_6$ in a film-forming gas in the film-forming operation. Further, according to Embodiment 2, B is doped in forming the amorphous silicon film 203 shown by FIG. 3(A).

These operations are carried out to control a threshold value of the TFT by forming a channel region of weak P type.

As a method of doping, B (boron) may be doped by a plasma doping process or an ion implantation process after forming the amorphous silicon film.

Further, in fabricating the TFT of P-channel type, P (phosphor) is doped.

(Embodiment 5)

According to this embodiment, a silicon material is used as a gate electrode in the construction shown by Embodiment 1 and Embodiment 2.

(Embodiment 6)

According to this embodiment, an ion implantation process is used as a method of introducing a metal element for promoting the crystallization of silicon in the steps shown by Embodiment 1 and Embodiment 2. That is, the nickel element is introduced into the amorphous silicon film by accelerating nickel ions with an electric field and implanting the ions into the amorphous silicon film.

When the ion implantation process is used, a resulting advantage is that the amount of nickel element introduced into the film can be controlled finely.

(Embodiment 7)

This embodiment shows steps of fabricating a thin film transistor circuit that is formed in a complementary type by removing a metal element, as disclosed above.

Figure 5A:
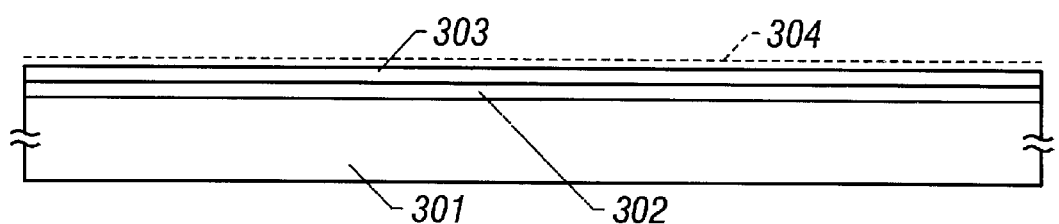
FIGS. 5(A), 5(B), 5(C), 5(D) and 5(E) are views showing fabrication steps of a thin film transistor.

First, as shown by FIG. 5(A), an underlayer film 302 comprising a silicon oxide film is formed on a glass substrate 301. Next, an amorphous silicon film 303 is formed. Further, a state in which nickel element is brought into contact with and held by the entire surface of the amorphous silicon film 303, as designated by the numeral 304, is provided by using a nickel acetate solution. (FIG. 5(A))

Figure 5B:
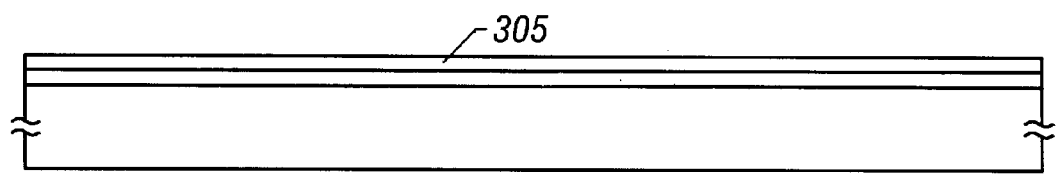

Next, the amorphous silicon film 303 is crystallized by performing a heating treatment. (FIG. 5(B))

Figure 5C:
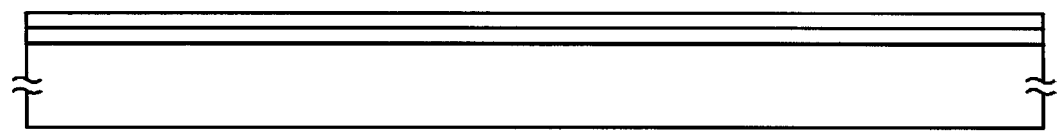

Further, a laser beam is irradiated as shown by FIG. 5(C).

Figure 5D:
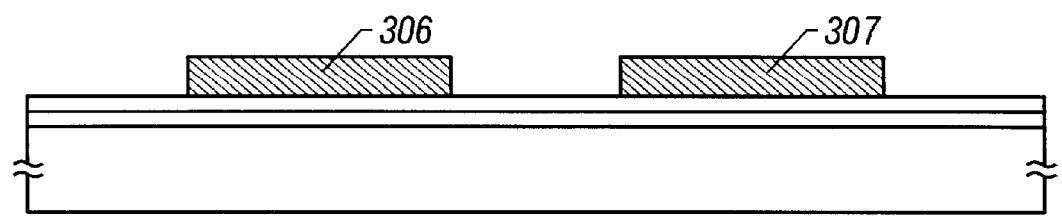

Next, masks 306 and 307, each comprising a silicon oxide film, are formed. (FIG. 5(D))

Figure 5E:
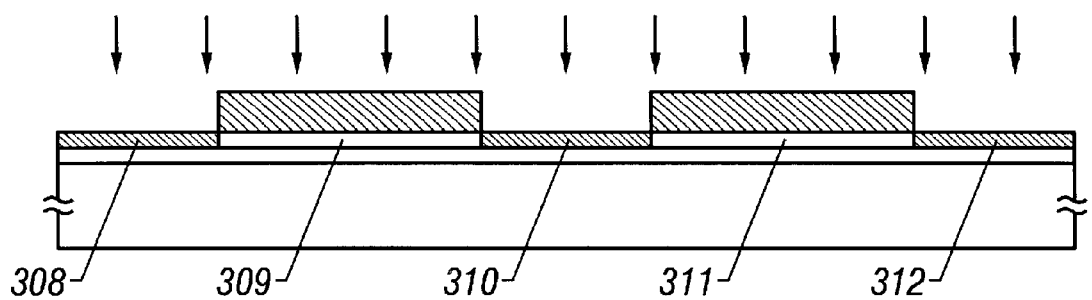

Next, heavy doping of P (phosphor) ions is carried out as shown by FIG. 5(E).

In this step, P ions are accelerated and implanted into regions 308, 310 and 312. Further, P ions are not accelerated and implanted to regions 309 and 311.

Figure 6A:
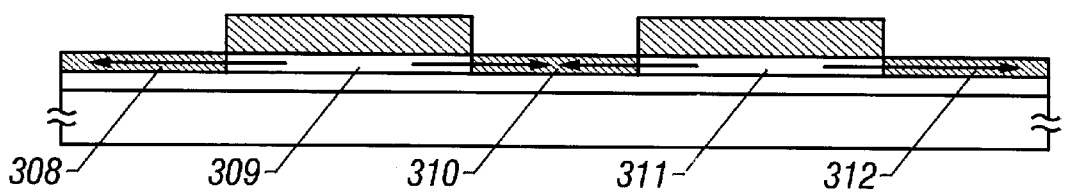
FIGS. 6(A), 6(B), 6(C), 6(D) and 6(E) are views showing fabrication steps of a thin film transistor.

Next, as shown by FIG. 6(A), the nickel element is gettered by performing a heating treatment in an atmosphere that includes a mixture of oxygen and nitrogen.

Figure 6B:
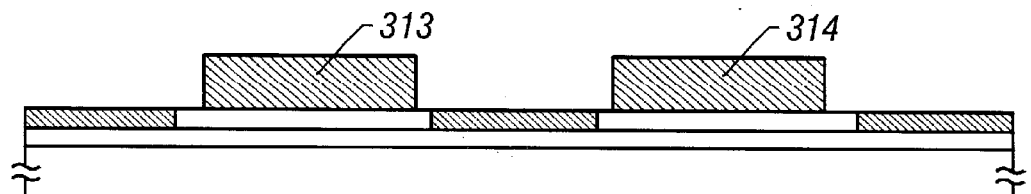

Thereafter, the masks 306 and 307, each comprising a silicon oxide film, are removed. Then, resist masks 313 and 314 are formed as shown by FIG. 6(B).

Figure 6C:
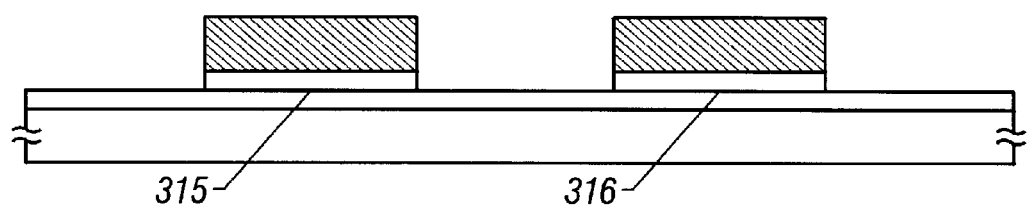

Next, the silicon film is patterned by utilizing the resist masks 313 and 314. In this way, patterns each comprising a crystalline silicon film, as designated by numerals 315 and 316, are provided. One of the patterns is to constitute an activation layer of a TFT of the P-channel type, and the other is to constitute an activation layer of a TFT of the N-channel type. (FIG. 6(C))

Next, a gate insulating film comprising a thermally oxidized film 318 and a silicon oxide film 319, formed by a plasma CVD process, are formed.

Further, gate electrodes 321 and 323, each comprising aluminum, are formed, and anodized films 320 and 322 are formed on the surfaces.

Next, a source region 324 and a drain region 326 of a thin film transistor of the P-channel type are formed by selectively doping P and B by using a resist mask (not illustrated).

Figure 6D:
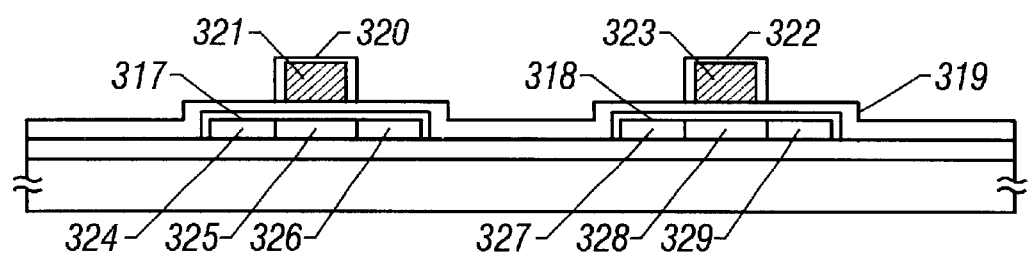

Further, a source region 329 and a drain region 327 of a thin film transistor of the N-channel type are formed. (FIG. 6(D))

Further, a laser beam is irradiated and the source and drain regions are activated.

Next, a silicon nitride film 330 is formed and a polyimide resin film 331 is formed to create an interlayer insulating film. Then, contact holes are formed, and a source electrode 332 of a P-channel type TFT, a source electrode 334 of an N-channel type TFT, and a drain electrode 333 common to both TFTs are formed.

Figure 6E:
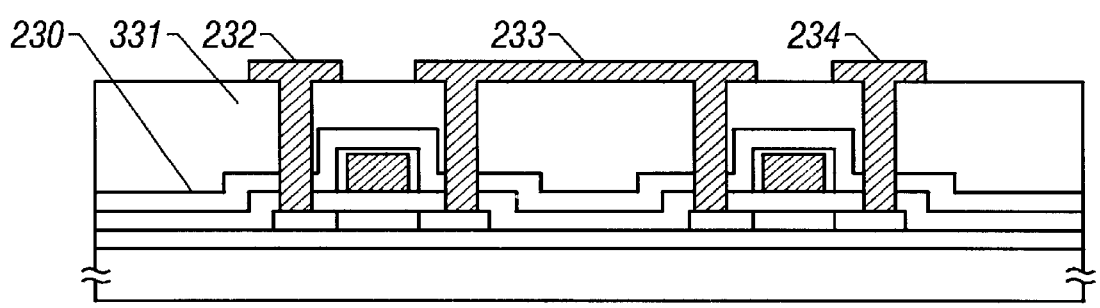

In this way, a circuit in which the P-channel type TFT and the N-channel type TFT are formed in a complementary type is obtained, as shown by FIG. 6(E).

While in this embodiment the amorphous silicon film 303 is crystallized by using the crystallizing method explained in Embodiment 1, the crystallizing method explained in Embodiment 2 can also be used.

(Embodiment 8)

Figure 7A:
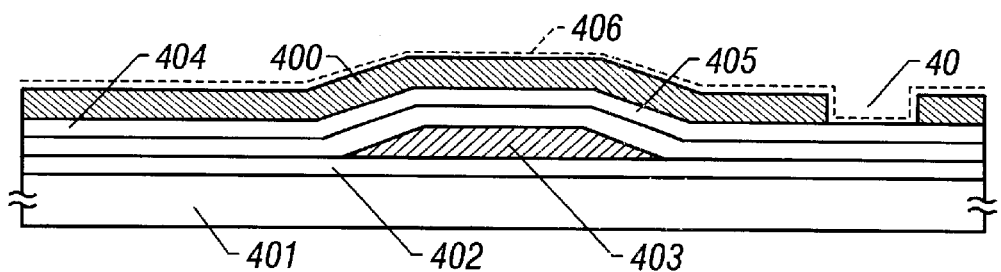
FIGS. 7(A), 7(B), 7(C), 7(D) and 7(E) are views showing fabrication steps of a thin film transistor.

This embodiment shows fabrication steps of a thin film transistor of a reverse stagger type. First, as shown by FIG. 7(A), a silicon oxide film 402 is formed as an underlayer film on a glass substrate 401.

Further, a gate electrode 403 comprising a metal silicide is formed. Further, a gate insulating film 404 is formed.

Next, an amorphous silicon film 405 is formed. Next, a mask 400 comprising a silicon oxide film is formed. An opening 40 is provided in the mask.

Next, a state where nickel element is brought into contact with and held by the surface, as designated by numeral 406, is provided by using a nickel acetate solution. (FIG. 7(A))

Next, the amorphous silicon film 405 is crystallized by a heating treatment. In this case, crystal growth is progressed in a direction indicated by an arrow mark 41.

Figure 7B:
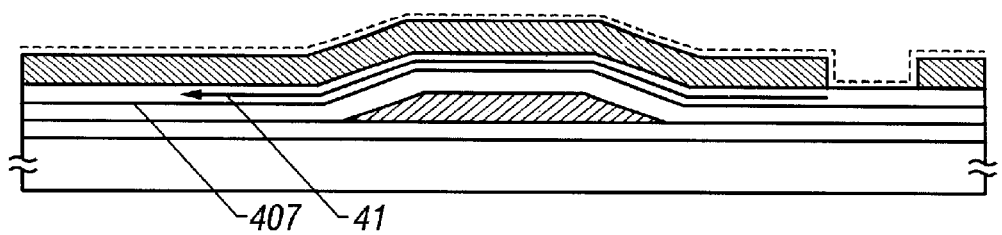

In this way, a crystalline silicon film 407 is obtained. (FIG. 7(B))

Figure 7C:
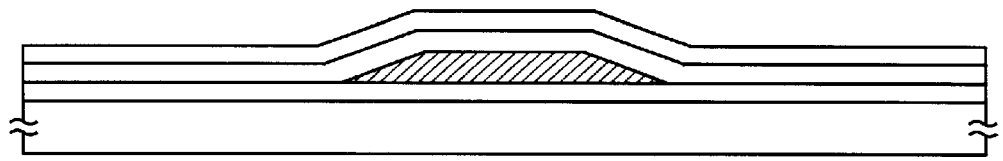

Next, a laser beam is irradiated. (FIG. 7(C))

Next, a mask 408, comprising a silicon oxide film, is formed. (FIG. 7(D))

Next, heavy doping of P (phosphor) element is carried out. In this step, heavy doping of P element is carried out at regions 409 and 411. Further, doping is not performed at a region 410. (FIG. 7(E))

Figure 8A:
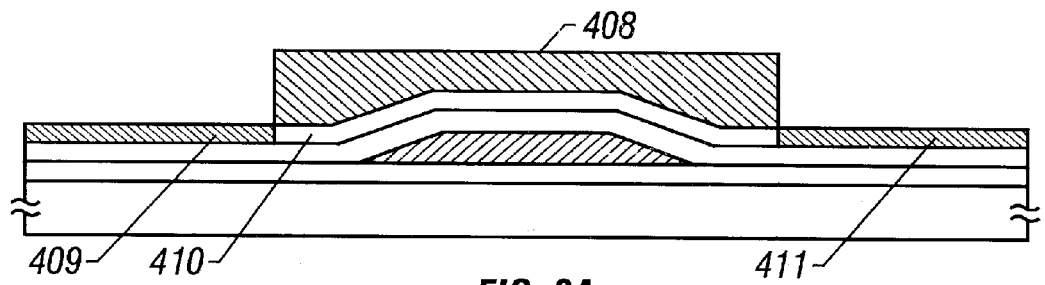
FIGS. 8(A), 8(B), 8(C), 8(D) and 8(E) are views showing fabrication steps of a thin film transistor.

Next, a heating treatment is carried out in an atmosphere that includes a mixture of HCl, oxygen and nitrogen, and nickel element is gettered as shown by FIG. 8(A).

Figure 8B:
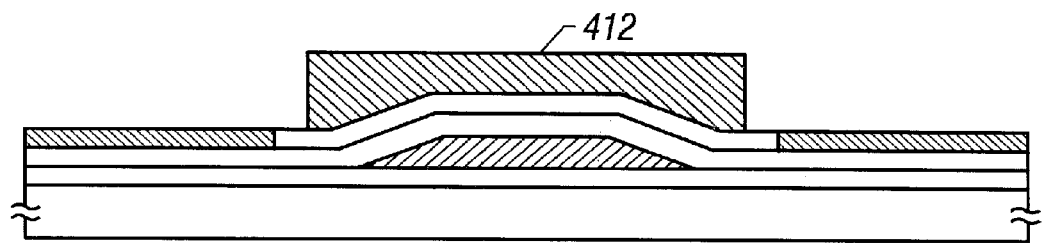

Thereafter, the mask 408 comprising a silicon oxide film is removed, and a resist mask 408 is newly formed. (FIG. 8(B))

Figure 8C:
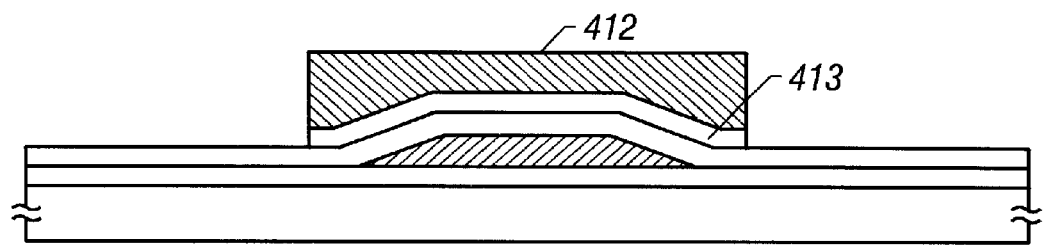

Further, the silicon film is patterned by using the resist mask 412. In this way, a pattern of a silicon film, designated by numeral 413, remains. (FIG. 8(C))

Figure 8D:
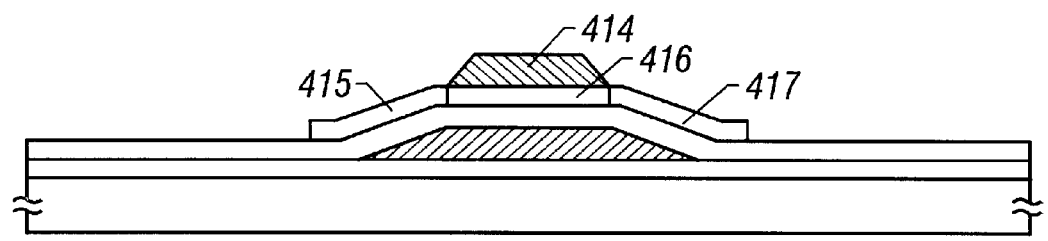

Next, a gate electrode 414 is provided, and doping of an impurity of one conductive type is carried out, using the gate electrode as a mask. In this way, a source region 415 and a drain region 417 are formed. (FIG. 8(D))

Further, a laser beam is irradiated and the source and the drain regions are activated.

Next, a silicon nitride film 418 and a polyimide resin film 419 are formed to constitute an interlayer insulating film.

Figure 8E:
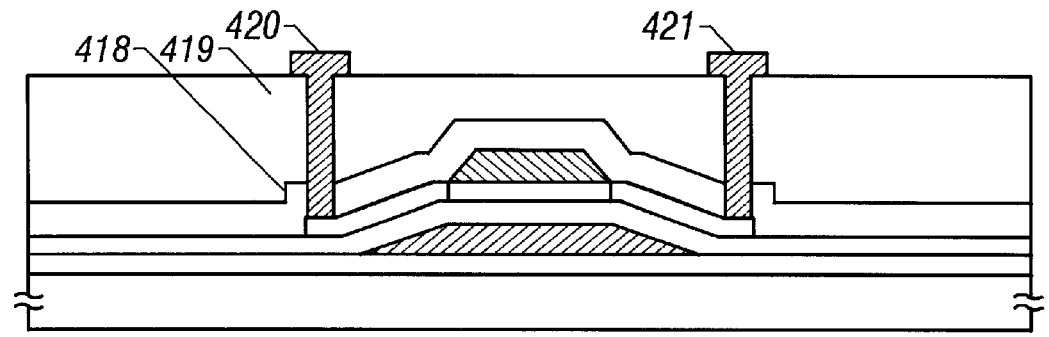

Further, contact holes are formed and a source electrode 420 and a drain electrode 421 are formed. In this way, a thin film transistor of a reverse stagger type is finished as shown by FIG. 8(E).

While in this embodiment the amorphous silicon film 405 is crystallized by using the crystallizing method explained in Embodiment 2, the crystallizing method explained in Embodiment 1 also can be used.

(Embodiment 9)

According to this embodiment, outlines of devices utilizing the present invention disclosed above are shown. FIGS. 9(A), 9(B), 9(C), 9(D), 9(E) and 9(F) show outlines of respective devices.

FIG. 9(A) shows a portable-type information-processing terminal that includes a communication function over a telephone network.

This electronic device is provided with an integrated circuit 2006 that includes thin film transistors inside its main body 2001. Further, a liquid crystal display 2005 of an active matrix type, a camera unit 2002 for taking pictures, and an operation switch 2004 are provided.

FIG. 9(B) shows an electronic device referred to as a head mount display. The device displays pictures pseudonymously in front of the eyes by mounting a main body 2101 onto the head by a band 2103. The pictures are formed by a liquid crystal display device 2102 in correspondence with left and right eyes.

In such an electronic device, a circuit that includes thin film transistors is used to make the device small-sized and light-weight.

FIG. 9(C) shows a device that displays map information or various information based on a signal from an artificial satellite. Information caught from a satellite by an antenna 2204 is processed by an electronic circuit installed inside a main body 2201, and necessary information is displayed at a liquid crystal display device 2202.

The operation of the device is carried out by operation switches 2203. Also, in such a device, a circuit that includes thin film transistors is used to reduce the size of the device.

FIG. 9(D) shows a portable telephone. The electronic device is provided with an antenna 2306, a voice output unit 2302, a liquid crystal display device 2304, operation switches 2305, and a voice input unit 2303 at a main body 2301.

An electronic device shown by FIG. 9(E) is a portable-type picture-taking device, usually referred to as a video camera. The electronic device includes a liquid crystal display 2402 attached to an opening-and-closing member and operation switches 2404 attached to an opening-and-closing member at a main body 2401.

Further, the main body 2401 includes a picture receiving unit 2406, an integrated circuit 2407, a voice input unit 2403, the operation switches 2404, and a battery 2405.

An electronic device shown by FIG. 9(F) is a projection type liquid crystal display device. The device is provided with a light source 2502, a liquid crystal display device 2503, and an optical system 2504 at a main body 2501 and has a function of projecting pictures onto a screen 2505.

Further, either a transmitting type or a reflecting type can be used for the liquid crystal display devices in the electronic devices shown above. The transmitting type has better display characteristics, and the reflecting type is advantageous when low power consumption or small-size and light-weight are important.

Further, a flat panel display of an EL (Electro-luminescence) display of an active matrix type, a plasma display, or the like can be utilized for the display device.

(Embodiment 10)

This embodiment shows a situation in which the fabrication steps of Embodiment 1 and Embodiment 2 are modified. FIGS. 10(A), 10(B), 10(C), 10(D) and 10(E) show fabrication steps of the embodiment.

First, an underlayer film 502 and a crystalline silicon film 503 are formed on a glass substrate 501 in accordance with the crystallizing steps shown by Embodiment 1 or Embodiment 2. Further, a mask 505 comprising a silicon oxide film (or silicon nitride film) is formed by using a resist mask 504. (FIG. 10(A))

Next, heavy doping of P (phosphor) is carried out in regions 506 and 507. (FIG. 10(B))

Next, isotropic ashing is carried out, and the resist mask 504 is isotropically retracted to a state designated by numeral 509. (FIG. 10(C))

Further, the mask 505 comprising a silicon oxide film is patterned again by utilizing the resist mask 509, and a pattern comprising a silicon oxide film designated by numeral 510 is formed. Further, the resist mask 509 is removed. (FIG. 10(D))

Figure 10A:
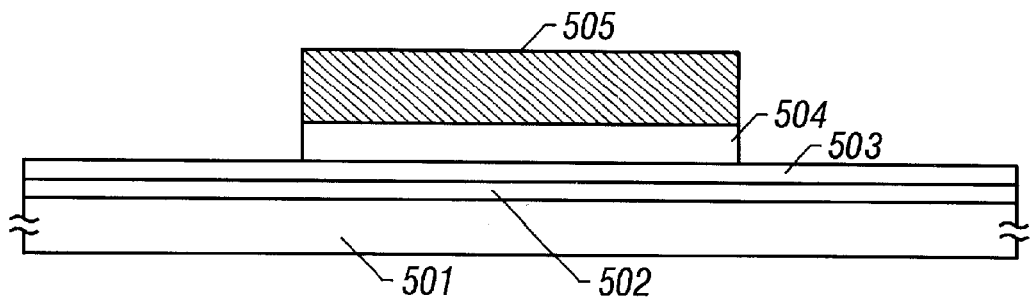
FIGS. 10(A), 10(B), 10(C), 10(D) and 10(E) are views showing fabrication steps of a thin film transistor.
Figure 10B:
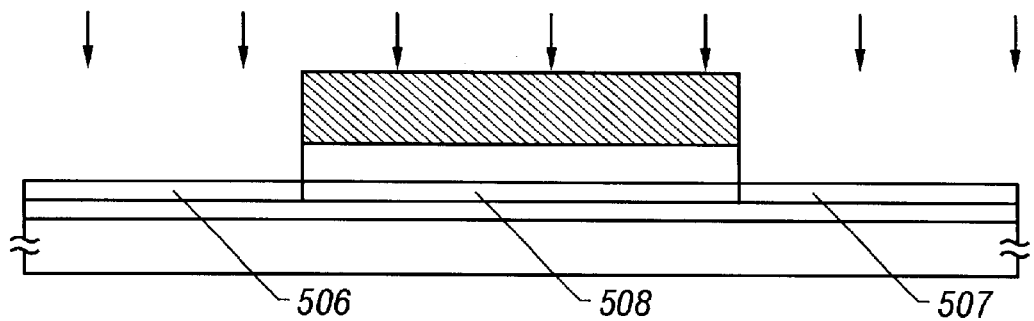
Figure 10C:
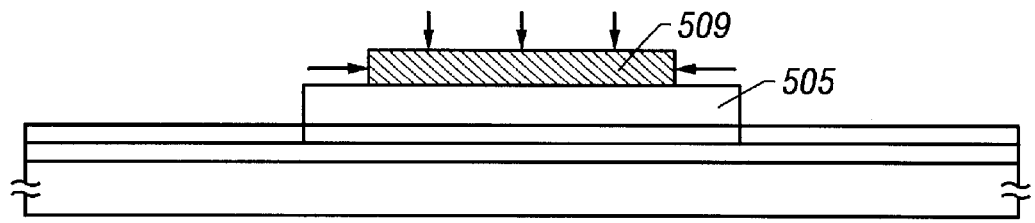
Figure 10D:
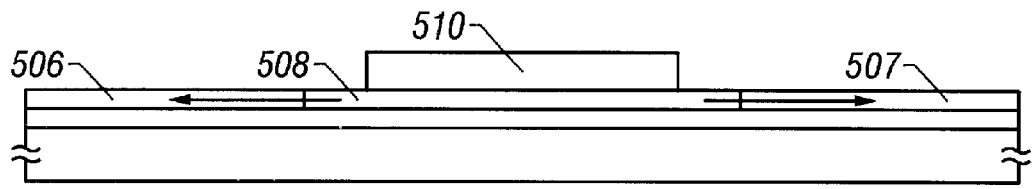

Further, a heating treatment is carried out in a state of FIG. 10(D), and nickel element is moved from a region 508 to the regions 506 and 507.

Then, the region of the silicon film designated by numeral 508 is patterned by utilizing the mask 510, in which a region 511 that is to constitute an activation layer of a thin film transistor in later steps is formed. Thereafter, a thin film transistor is fabricated in accordance with steps described in Embodiment 1 or other embodiments.

When the construction shown by this embodiment is adopted, the pattern of the silicon film designated by numeral 511 can be formed in a self-adjusting manner by utilizing the mask for implanting P ions.

(Embodiment 11)

This embodiment relates to a construction in which the fabrication steps described in Embodiment 1 and Embodiment 2 are improved. FIG. 11(A), 11(B), 11(C), 11(D), 11(E) and 11(F) show fabrication steps of this embodiment.

First, an underlayer film 602 is formed on a glass substrate 601. A crystalline silicon film 603 is formed in accordance with the crystallizing steps shown by Embodiment 1 or Embodiment 2.

Next, a mask 604 comprising a silicon oxide film (or silicon nitride film) is formed by utilizing a resist mask 605. (FIG. 11(A))

Next, heavy doping of P (phosphor) ions is carried out. In this step, heavy doping of P is carried out at regions 606 and 607. (FIG. 11(B))

Figure 11A:
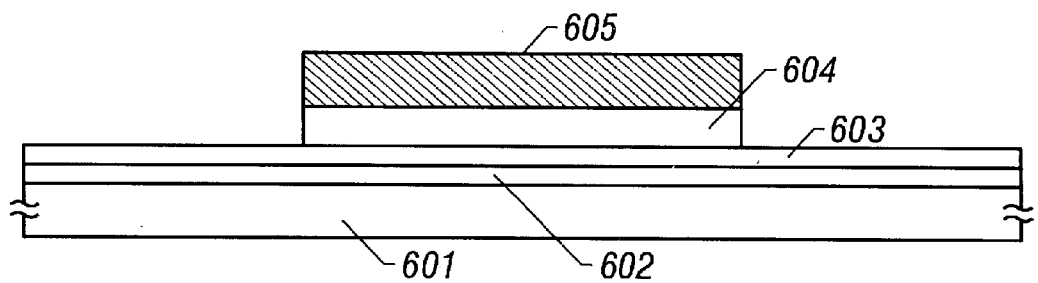
FIGS. 11(A), 11(B), 11(C), 11(D) and 11(E) are views showing fabrication steps of a thin film transistor.
Figure 11B:
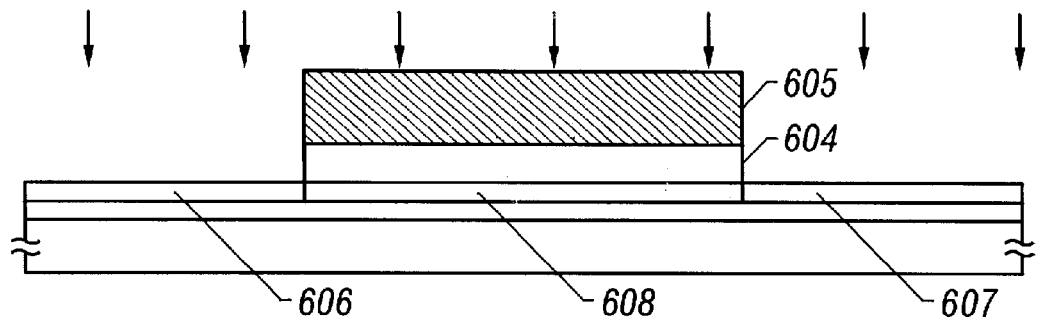
Figure 11C:
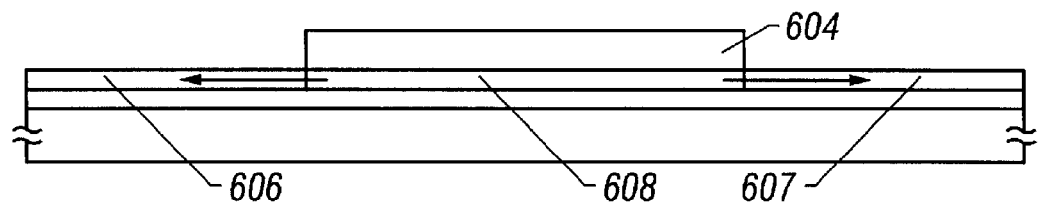
Figure 11D:
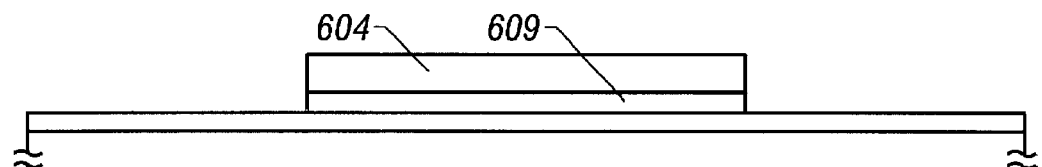

Thereafter, the resist mask 605 is removed. Further, nickel element is moved from a region 608 to the regions 606 and 607 by performing a heating treatment as shown by FIG. 11(C).

Next, the region 608 of the silicon film is patterned, utilizing the mask 604 comprising the silicon oxide film, to provide a region designated by numeral 609.

Next, isotropic etching is carried out, utilizing the mask 604 comprising the silicon oxide film, during which side faces of the pattern 609 of the silicon film are etched and a pattern designated by numeral 610 is provided. (FIG. 11(D))

Next, the mask 604 is removed, and an activation layer of a thin film transistor is formed by using the pattern of the silicon film designated by numeral 610.

When the construction shown by embodiment is adopted, the mask 604 can be utilized twice, and the activation layer pattern 610 can be self-adjusting.

Figure 11E:
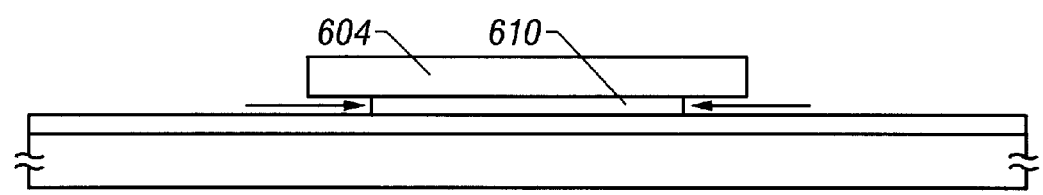

Further, it is important that regions 606 or 607, in which nickel element is not present at high concentrations, can be produced in the patterning operation of the silicon film shown by FIG. 11(E).

Figure 10E:
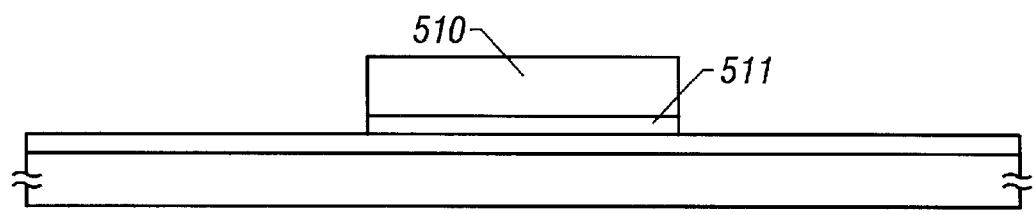

In performing the etching operation, there is a concern that the nickel element may be scattered and incorporated into a region that is ultimately to form an activation layer. For example, in the etching step during which the pattern 511 is formed, as shown by FIG. 10(E), there is a concern that the nickel element may be incorporated into the region 511 when objects that are to be removed by etching scatter from the regions 506 and 507.

However, in the step indicated by FIG. 11(E), this concern is alleviated since there are no regions 606 and 607 that include the nickel element at high concentrations.

(Embodiment 12)

Figure 12A:
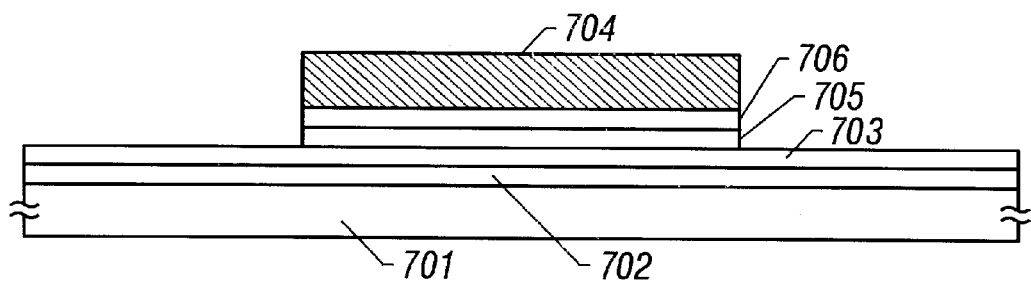
FIGS. 12(A), 12(B), 12(C), 12(D) and 12(E) are views showing fabrication steps of a thin film transistor.

This embodiment shows an example in which the fabrication steps shown in Embodiment 1 or Embodiment 2 are improved. First, an underlayer film 702 is formed on a glass substrate 701, as shown by FIG. 12(A), and a crystalline silicon film 703 is formed by utilizing the crystallizing method shown by Embodiment 1 or Embodiment 2.

Next, a mask, comprising a film laminated with a silicon oxide film 705 and a silicon nitride film 706, is formed by utilizing a resist mask 704. (FIG. 12(A))

Figure 12B:
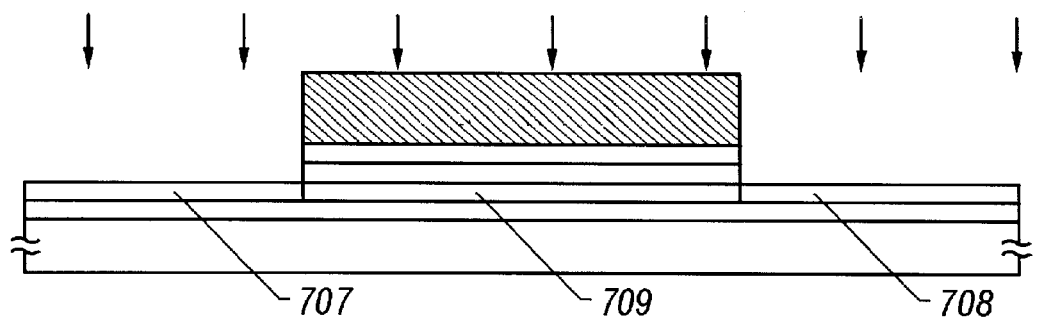

Next, heavy doping of P element is carried out. (FIG. 12(B))

Next, nickel element is moved from a region 709 to regions 707 and 708 by performing a heating treatment. (FIG. 12(C))

Next, the mask 705 of the silicon oxide film is etched through isotropic etching by utilizing the mask 706 of the silicon nitride film. As a result, a mask 710 comprising a silicon oxide film, side faces of which have been etched, is provided. (FIG. 12(D))

Figure 7D:
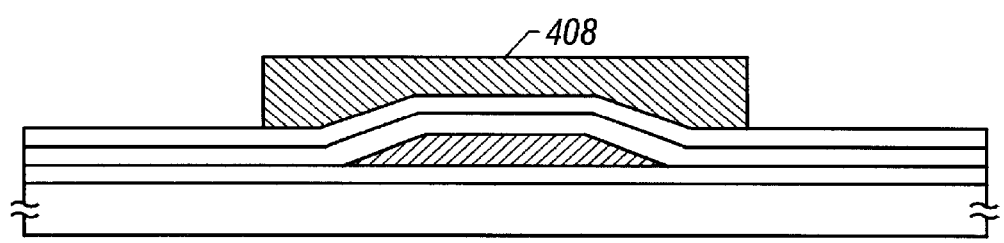

Next, the mask 706 of the silicon nitride film is removed, and a pattern 711 of a silicon film is provided by using the mask 710 produced in the step of FIG. 7(D).

Also, in this step, the pattern of the silicon film designated by numeral 711 can be self-adjusting.

Further, the following steps may be carried out among the steps shown by FIGS. 12(A), 12(B), 12(C), 12(D) and 12(E).

Figure 7E:
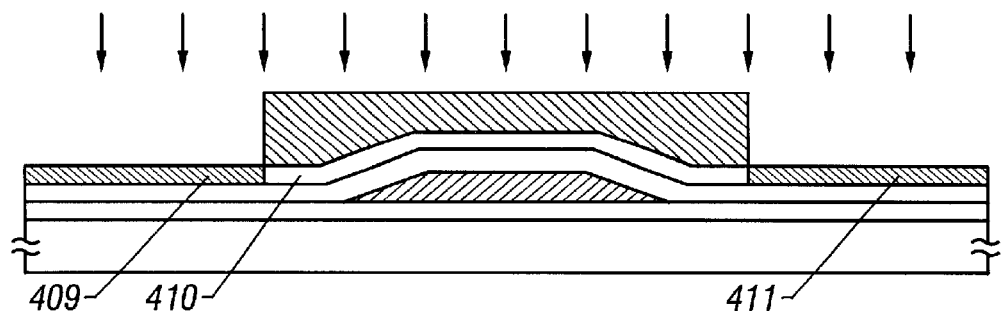
Figure 12C:
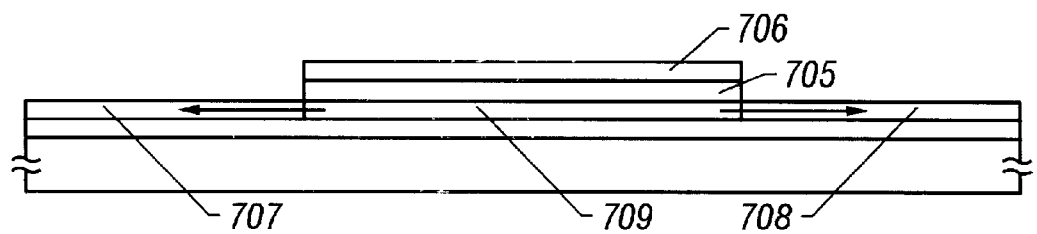
Figure 12D:
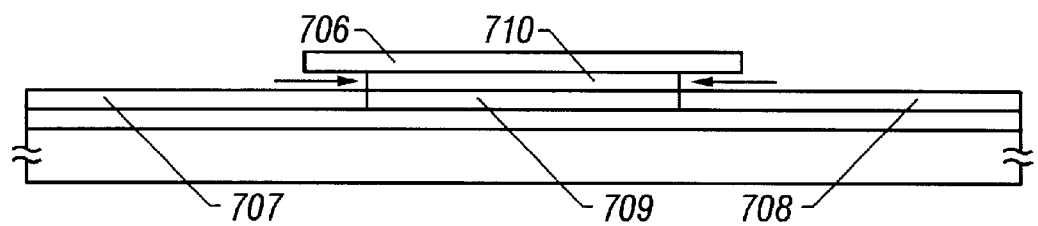
Figure 12E:
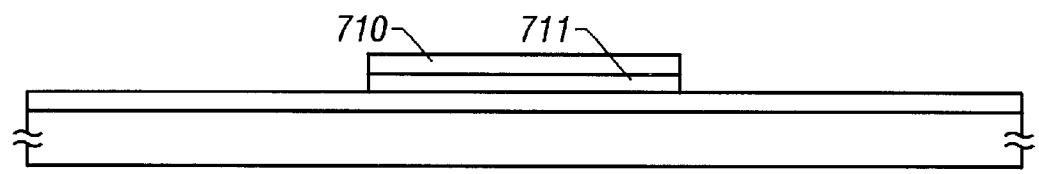

When the step of FIG. 12(C) is finished, the regions of exposed silicon films, that is, the regions 707 and 708, are removed. Further, the steps shown by FIGS. 7(D) and 7(E) are carried out.

Then, in forming the pattern of the silicon film designated by the numeral 711, the influence of nickel element contained in the regions 707 and 708 at high concentrations can be excluded.

By utilizing the invention disclosed in the specification, when a thin film transistor is fabricated by utilizing a metal element for promoting the crystallization of silicon, the concentration of the metal element remaining in an activation layer can be reduced. Further, problems of dispersion or unstableness can be improved.

What is claimed is:

1. A method of manufacturing a semiconductor device comprising the steps of:

forming a semiconductor film comprising amorphous silicon on an insulating surface;

providing at least a part of said semiconductor film with a catalyst metal for promoting crystallization of said amorphous silicon;

first heating said semiconductor film and said catalyst metal to crystallize said semiconductor film;

forming a mask over a portion of the crystallized semiconductor film;

introducing an impurity ion selectively into another portion of said crystallized semiconductor film by using said mask;

second heating said crystallized semiconductor film after the introduction of said impurity ion whereby the catalyst metal present in the portion below said mask shifts into said another portion; and removing said another portion to form an active region of the semiconductor device by utilizing the portion below said mask after the second heating.

2. A method according to claim 1 wherein said second heating is performed in an atmosphere containing oxygen.

3. A method according to claim 1 wherein said catalyst metal is selected from the group consisting of Fe, Co, Ni, Ru, Rh, Pd, Os, Ir, Pt, Cu, Au and a combination thereof.

4. A method according to claim 1 wherein said impurity ion is phosphorus ion.

5. A method of manufacturing a semiconductor device comprising the steps of:

forming a semiconductor film comprising amorphous silicon on an insulating surface;

providing at least a part of said semiconductor film with a catalyst metal for promoting crystallization of said amorphous silicon;

first heating said semiconductor film and said catalyst metal to crystallize said semiconductor film;

irradiating the crystallized semiconductor film with a laser light after the first heating;

forming a mask over a portion of said crystallized semiconductor film;

introducing an impurity ion selectively into another portion of said crystallized semiconductor film by using said mask;

second heating said crystallized semiconductor film after the introduction of said impurity ion whereby the catalyst metal present in the portion below said mask shifts into said another portion; and removing said another portion to form an active region of the semiconductor device by utilizing the portion below said mask after the second heating.

6. A method according to claim 5 wherein said second heating is performed in an atmosphere containing oxygen.

7. A method according to claim 5 wherein said catalyst metal is selected from the group consisting of Fe, Co, Ni, Ru, Rh, Pd, Os, Ir, Pt, Cu, Au and a combination thereof.

8. A method according to claim 5 wherein said impurity ion is phosphorus ion.

9. A method of manufacturing a semiconductor device comprising the steps of:

forming a semiconductor film comprising amorphous silicon on an insulating surface;

providing a selected region of said semiconductor film with a catalyst metal for promoting crystallization of said amorphous silicon;

first heating said semiconductor film and said catalyst metal to crystallize said semiconductor film wherein crystals grow from said selected region horizontally through the semiconductor film;

forming a mask over a portion of the crystallized semiconductor film;

providing an impurity ion selectively with another portion of said crystallized semiconductor film by using said mask;

second heating said crystallized semiconductor film after the provision of said impurity ion whereby the catalyst metal present in the portion below said mask shifts into said another portion; and removing said another portion to form an active region of the semiconductor device by utilizing the portion below said mask after the second heating.

10. A method according to claim 9 wherein said second heating is performed in an atmosphere containing oxygen.

11. A method according to claim 9 wherein said catalyst metal is selected from the group consisting of Fe, Co, Ni, Ru, Rh, Pd, Os, Ir, Pt, Cu, Au and a combination thereof.

12. A method according to claim 9 wherein said impurity ion is phosphorus ion.

13. A method according to claim 9 wherein said mask is located so as not to cover said selected region.

14. A method of manufacturing a semiconductor device comprising the steps of:

forming a semiconductor film comprising amorphous silicon on an insulating surface;

providing a selected region of said semiconductor film with a catalyst metal for promoting crystallization of said amorphous silicon;

first heating said semiconductor film and said catalyst metal to crystallize said semiconductor film wherein crystals grow from said selected region horizontally through the semiconductor film;

irradiating the crystallized semiconductor film with a laser light after said first heating;

forming a mask over a portion of said crystallized semiconductor film;

introducing an impurity ion selectively into another portion of said crystallized semiconductor film by using said mask;

second heating said crystallized semiconductor film after the introduction of said impurity ion whereby the catalyst metal present in the portion below said mask shifts into said another portion; and removing said another portion to form an active region of the semiconductor device by utilizing the portion below said mask after the second heating.

15. A method according to claim 14 wherein said second heating is performed in an atmosphere containing oxygen.

16. A method according to claim 14 wherein said catalyst metal is selected from the group consisting of Fe, Co, Ni, Ru, Rh, Pd, Os, Ir, Pt, Cu, Au and a combination thereof.

17. A method according to claim 14 wherein said impurity ion is phosphorus ion.

18. A method according to claim 14 wherein said mask is located so as not to cover said selected region.

19. A method of manufacturing a semiconductor device comprising the steps of:

forming a semiconductor film comprising amorphous silicon on an insulating surface;

providing at least a part of said semiconductor film with a catalyst metal for promoting crystallization of said amorphous silicon;

first heating said semiconductor film and said catalyst metal to crystallize said semiconductor film;

forming a mask over a portion of the crystallized semiconductor film;

providing an impurity ion selectively with another portion of said crystallized semiconductor film by using said mask;

second heating said crystallized semiconductor film after the provision of said impurity ion whereby the catalyst metal present in the portion is absorbed by said another portion;

forming a semiconductor island from said portion of said crystallized semiconductor film below said mask by patterning after the second heating;

depositing a gate insulating film comprising silicon oxide on said semiconductor island by vapor deposition; and thermally oxidizing a surface of the semiconductor island after the deposition of the gate insulating film.

20. A method according to claim 19 wherein said thermally oxidizing is conducted in an oxidizing atmosphere containing chlorine.

21. A method of manufacturing a semiconductor device comprising the steps of:

forming a semiconductor film comprising amorphous silicon on an insulating surface;

providing a selected region of said semiconductor film with a catalyst metal for promoting crystallization of said amorphous silicon;

first heating said semiconductor film and said catalyst metal to crystallize said semiconductor film wherein crystals grow from said selected region horizontally through said semiconductor film;

forming a mask over a portion of the crystallized semiconductor film;

introducing an impurity ion selectively into another portion of said crystallized semiconductor film by using said mask;

second heating said crystallized semiconductor film after the introduction of said impurity ion whereby the catalyst metal present in the portion is absorbed by said another portion;

forming a semiconductor island from said portion of said crystallized semiconductor film below said mask by patterning after the second heating;

depositing a gate insulating film comprising silicon oxide on said semiconductor island by vapor deposition; and thermally oxidizing a surface of the semiconductor island after the deposition of the gate insulating film.

22. A method according to claim 21 wherein said thermally oxidizing is conducted in an oxidizing atmosphere containing chlorine.

23. A method according to claim 19 wherein said catalyst metal is selected from the group consisting of Fe, Co, Ni, Ru, Rh, Pd, Os, Ir, Pt, Cu, Au and a combination thereof.

24. A method according to claim 21 wherein said catalyst metal is selected from the group consisting of Fe, Co, Ni, Ru, Rh, Pd, Os, Ir, Pt, Cu, Au and a combination thereof.

25. A method of manufacturing a semiconductor device comprising the steps of:

forming a semiconductor film comprising amorphous silicon on an insulating surface;

providing at least a part of said semiconductor film with a catalyst metal for promoting crystallization of said amorphous silicon;

first heating said semiconductor film and said catalyst metal to crystallize said semiconductor film;

forming a mask over a portion of the crystallized semiconductor film;

providing an impurity ion selectively with another portion of said crystallized semiconductor film by using said mask;

second heating said crystallized semiconductor film after the provision of said impurity ion whereby the catalyst metal present in the portion below said mask shifts into said another portion; and removing said another portion to form an active region of the semiconductor device outside of said another portion where the catalyst metal is segregated after the second heating step.

26. A method according to claim 25 wherein said second heating is performed in an atmosphere containing oxygen.

27. A method according to claim 25 wherein said catalyst metal is selected from the group consisting of Fe, Co, Ni, Ru, Rh, Pd, Os, Ir, Pt, Cu, Au and a combination thereof.

28. A method of manufacturing a semiconductor device comprising the steps of:

forming a semiconductor film comprising amorphous silicon on an insulating surface;

providing at least a part of said semiconductor film with a catalyst metal for promoting crystallization of said amorphous silicon;

first heating said semiconductor film and said catalyst metal to crystallize said semiconductor film;

forming a mask over a portion of the crystallized semiconductor film;

introducing an impurity ion selectively into another portion of said crystallized semiconductor film by using said mask;

second heating said crystallized semiconductor film after the introduction of said impurity ion whereby the catalyst metal present in the portion below said mask shifts into said another portion; and removing said another portion to form an active region of the semiconductor device below said mask after the second heating step, wherein the catalyst metal has been removed to outside of said active region of the semiconductor device.

29. A method according to claim 28 wherein said second heating is performed in an atmosphere containing oxygen.

30. A method according to claim 28 wherein said catalyst metal is selected from the group consisting of Fe, Co, Ni, Ru, Pd, Os, Ir, Pt, Cu, Au and a combination thereof.

31. A method according to claim 1 wherein said semiconductor device constitutes an electronic device selected from the group consisting of a portable type information processing terminal device, a head mount display, a displaying map information device based on a signal from an artificial satellite, a video camera, a portable telephone, a reflection type projection display, a transmission type projection display, an electroluminescence display and a plasma display.

32. A method according to claim 5 wherein said semiconductor device constitutes an electronic device selected from the group consisting of a portable type information processing terminal device, a head mount display, a displaying map information device based on a signal from an artificial satellite, a video camera, a portable telephone, a reflection type projection display, a transmission type projection display, an electroluminescence display and a plasma display.

33. A method according to claim 9 wherein said semiconductor device constitutes an electronic device selected from the group consisting of a portable type information processing terminal device, a head mount display, a displaying map information device based on a signal from an artificial satellite, a video camera, a portable telephone, a reflection type projection display, a transmission type projection display, an electroluminescence display and a plasma display.

34. A method according to claim 14 wherein said semiconductor device constitutes an electronic device selected from the group consisting of a portable type information processing terminal device, a head mount display, a displaying map information device based on a signal from an artificial satellite, a video camera, a portable telephone, a reflection type projection display, a transmission type projection display, an electroluminescence display and a plasma display.

35. A method according to claim 19 wherein said semiconductor device constitutes an electronic device selected from the group consisting of a portable type information processing terminal device, a head mount display, a displaying map information device based on a signal from an artificial satellite, a video camera, a portable telephone, a reflection type projection display, a transmission type projection display, an electroluminescence display and a plasma display.

36. A method according to claim 21 wherein said semiconductor device constitutes an electronic device selected from the group consisting of a portable type information processing terminal device, a head mount display, a displaying map information device based on a signal from an artificial satellite, a video camera, a portable telephone, a reflection type projection display, a transmission type projection display, an electroluminescence display and a plasma display.

37. A method according to claim 25 wherein said semiconductor device constitutes an electronic device selected from the group consisting of a portable type information processing terminal device, a head mount display, a displaying map information device based on a signal from an artificial satellite, a video camera, a portable telephone, a reflection type projection display, a transmission type projection display, an electroluminescence display and a plasma display.

38. A method according to claim 28 wherein said semiconductor device constitutes an electronic device selected from the group consisting of a portable type information processing terminal device, a head mount display device, a displaying map information device based on a signal from an artificial satellite, a video camera, a portable telephone, a reflection type projection display, a transmission type projection display, an electroluminescence display and a plasma display.

* * * * *